(12) United States Patent
Kuznia et al.

(10) Patent No.: US 12,107,390 B2
(45) Date of Patent: Oct. 1, 2024

(54) CIRCUIT SUBSTRATE LIGHT COUPLER

(71) Applicant: ULTRA COMMUNICATIONS, INC., Vista, CA (US)

(72) Inventors: Charles B. Kuznia, Encinitas, CA (US); Vernon Eugene Shrauger, Cambridge, MA (US); Joseph Farzin Ahadian, San Marcos, CA (US)

(73) Assignee: ULTRA COMMUNICATIONS, INC., Vista, CA (US)

( * ) Notice: Subject to any disclaimer, the term of this patent is extended or adjusted under 35 U.S.C. 154(b) by 898 days.

(21) Appl. No.: 17/006,817

(22) Filed: Aug. 29, 2020

(65) Prior Publication Data

US 2022/0216667 A1    Jul. 7, 2022

Related U.S. Application Data

(60) Provisional application No. 62/908,057, filed on Sep. 30, 2019.

(51) Int. Cl.
| | |
|---|---|
| *H01S 5/0683* | (2006.01) |
| *G02B 6/42* | (2006.01) |
| *H01S 5/02325* | (2021.01) |
| *H01S 5/026* | (2006.01) |
| *H01S 5/12* | (2021.01) |

(52) U.S. Cl.
CPC ............ *H01S 5/0683* (2013.01); *G02B 6/428* (2013.01); *G02B 6/4286* (2013.01); *G02B 6/4295* (2013.01); *H01S 5/02325* (2021.01); *H01S 5/0264* (2013.01); *H01S 5/12* (2013.01)

(58) Field of Classification Search
CPC .... H01S 5/0264; H01S 5/021; H01S 5/02325; H01S 5/0683; H01S 5/12; H01S 5/0014; H01S 5/02326; H01S 5/02251; H01S 5/02315; H01S 5/0239; H01S 5/4025; H01S 5/4031; G02B 6/428; G02B 6/4286; G02B 6/4295
See application file for complete search history.

(56) References Cited

U.S. PATENT DOCUMENTS

| | | | | |
|---|---|---|---|---|
| 5,881,193 | A * | 3/1999 | Anigbo ............... | G02B 6/4244 385/94 |
| 6,527,458 | B2 * | 3/2003 | Kim ..................... | G02B 6/4246 398/139 |
| 6,575,641 | B2 * | 6/2003 | Yamabayashi ....... | G02B 6/4202 372/32 |
| 8,348,522 | B2 * | 1/2013 | Kuznia ................. | G02B 6/43 385/88 |
| 8,854,609 | B2 * | 10/2014 | Ahadian .............. | G01N 21/958 356/73.1 |
| 9,429,496 | B2 * | 8/2016 | Kuznia ............ | G01M 11/3154 |

(Continued)

FOREIGN PATENT DOCUMENTS

JP    10341062    * 12/1998    ............. H01S 3/18

*Primary Examiner* — M. A. Golub-Miller
(74) *Attorney, Agent, or Firm* — Steinfl + Bruno LLP (57) ABSTRACT

Methods and systems for an ASIC with a laser with the laser's back-facet illumination being monitored by a photodetector situated such that the substrate of the ASIC acts as a waveguide for the back-facet illumination between the laser and the photodetector (monitor). In an embodiment, the laser and monitor are situated on the same side of the ASIC and the back-facet illumination is reflected off the far end of the ASIC substrate before reaching the monitor.

21 Claims, 6 Drawing Sheets

(56) References Cited

U.S. PATENT DOCUMENTS

| | | | | |
|---|---|---|---|---|
| 10,120,149 | B1* | 11/2018 | Mathai | G02B 6/29365 |
| 10,900,867 | B2* | 1/2021 | Kuznia | G01M 11/3154 |
| 2001/0033722 | A1* | 10/2001 | Okada | G02B 6/4243 |
| | | | | 385/94 |
| 2003/0102496 | A1* | 6/2003 | Kuhara | G02B 6/4286 |
| | | | | 257/233 |
| 2004/0021144 | A1* | 2/2004 | Schrodinger | H01L 25/167 |
| | | | | 257/432 |
| 2004/0179784 | A1* | 9/2004 | Vancoille | G02B 6/4214 |
| | | | | 385/47 |
| 2005/0189473 | A1* | 9/2005 | Schrodinger | H01S 5/423 |
| | | | | 250/214.1 |
| 2006/0215726 | A1* | 9/2006 | Alduino | G02B 6/4214 |
| | | | | 372/108 |
| 2011/0097037 | A1* | 4/2011 | Kuznia | G01N 21/55 |
| | | | | 264/1.24 |
| 2012/0176680 | A1* | 7/2012 | Ahadian | H01L 27/14685 |
| | | | | 427/532 |
| 2013/0208264 | A1* | 8/2013 | Ahadian | G01N 21/55 |
| | | | | 356/73.1 |
| 2013/0336652 | A1* | 12/2013 | Ogawa | H04B 10/61 |
| | | | | 398/38 |
| 2014/0079352 | A1* | 3/2014 | Lin | G02B 6/12002 |
| | | | | 385/14 |
| 2014/0099059 | A1* | 4/2014 | Pommer | G02B 6/4201 |
| | | | | 385/33 |
| 2014/0226988 | A1* | 8/2014 | Shao | H04B 10/40 |
| | | | | 398/139 |
| 2014/0314422 | A1* | 10/2014 | Shao | H04B 10/40 |
| | | | | 398/138 |
| 2015/0030285 | A1* | 1/2015 | Tanazawa | G02B 6/4214 |
| | | | | 385/31 |
| 2015/0086220 | A1* | 3/2015 | Warren | G02B 6/4286 |
| | | | | 29/428 |
| 2015/0293316 | A1* | 10/2015 | Sun | G02B 6/4214 |
| | | | | 385/14 |
| 2015/0331211 | A1* | 11/2015 | Kuo | G02B 6/4295 |
| | | | | 385/33 |
| 2016/0252690 | A1* | 9/2016 | Kawamura | G02B 6/4214 |
| | | | | 398/79 |
| 2016/0341903 | A1* | 11/2016 | Tang | G02B 6/4206 |
| 2017/0168250 | A1* | 6/2017 | Zhang | H01S 5/02251 |
| 2018/0191128 | A1* | 7/2018 | Chen | G02B 6/12004 |
| 2018/0252877 | A1* | 9/2018 | Engel | G02B 6/428 |
| 2022/0116117 | A1* | 4/2022 | Nagao | H04B 10/503 |

\* cited by examiner

CIRCUIT SUBSTRATE LIGHT COUPLER

CROSS REFERENCE TO RELATED APPLICATIONS

This application claims priority to U.S. Provisional Application No. 62/908,057 filed on Sep. 30, 2019, the contents of which are incorporated by reference herein in its entirety.

GOVERNMENT SUPPORT

This invention was made with government support under contract FA-8750-16-C-0296 with the Air Force Research Laboratory. The US government has certain rights in the invention.

TECHNICAL FIELD

The present teachings relate to the field of packaging for semiconductor lasers, for example ASIC mounted laser diodes. More particularly, the present teachings relate to methods and systems for monitoring the output of laser diodes mounted on a circuit substrate.

BACKGROUND

One way to monitor the output of a laser diode is to package the laser with a photodiode coupled to the laser's back end to monitor the light escaping the laser's back-facet. Since the light from the laser's back-facet is proportional to the laser's output light, the back-facet monitor can be used as a feed-back source for the laser drive circuits to aid in laser control and stabilization, as well as other applications that require data on the laser's output.

This can be impractical, however, for some ASIC (application specific integrated circuit) designs, such as multi-channel modules, which require the laser to be located close to the ASIC, not leaving room for a back-facet monitor.

SUMMARY

According to a first aspect of the present disclosure, an integrated circuit comprising: a laser, the laser having a back-facet that provides back-facet illumination; a substrate having a near end and a far end, the laser being situated such that the back-facet is optically coupled to the near end; and a monitor capable of detecting photons, the monitor being optically coupled to the near end and offset from the laser; wherein the substrate is transparent to a wavelength of light from the laser and the far end is reflective of at least a portion of the back-facet illumination.

According to a second aspect of the present disclosure, a method of monitoring the output of a laser on an integrated circuit, the method comprising: providing the laser on a near end of the integrated circuit, with a back-facet of the laser optically coupled to a substrate of the integrated circuit and providing back-facet illumination; providing a monitor capable of detecting photons on the near end of the integrated circuit, offset from the laser and optically coupled to the substrate; and selecting the laser and the substrate such that a wavelength of the laser is transparent to the substrate and a far end of the substrate is reflective of at least a portion of the back-facet illumination.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

FIGS. 1A-1B show an example ASIC with back-facet reflection laser monitoring. FIG. 1A shows the oblique view and FIG. 1B shows the top view.

FIGS. 2A-2B show an example embodiment of back-facet reflection laser monitoring in operation. FIG. 2A shows the top view and FIG. 2B shows the side view.

DETAILED DESCRIPTION

Throughout this description, embodiments and variations are described for the purpose of illustrating uses and implementations of the inventive concept. The illustrative description should be understood as presenting examples of the inventive concept, rather than as limiting the scope of the concept as disclosed herein.

The present disclosure describes example configurations for using the ASIC substrate as a lightguide for laser back/front/side-facet monitoring. A person skilled in the art would clearly understand that the teachings according to the present disclosure are not limited to such exemplary configurations.

As used herein, "laser" refers to any device that utilizes light amplification by stimulated emission of (electromagnetic) radiation. This includes laser diodes, quantum cascade laser, and optical fiber lasers. This includes distributed feedback (DFB) lasers. The term "back-facet" refers to the side of the laser opposite its main output where light is allowed to escape to enable monitoring of the laser output without directly interfering with the output beam.

As used herein, "monitor" refers to any photodetection device that converts a photonic input into an electrical signal output. This includes edge detecting and surface detecting devices.

As used herein, "ASIC", which stands for "application specific integrated circuit" refers to an integrated circuit (IC) designed for a specific use, such as multi-channel optical data transmission. The ASIC is situated on a substrate, such as silicon or gallium arsenide. The integrated circuit can be board-on-chip, package-on-package, package-in-package, system-in-package, flip-chip, or any other IC design.

Figure 1A:
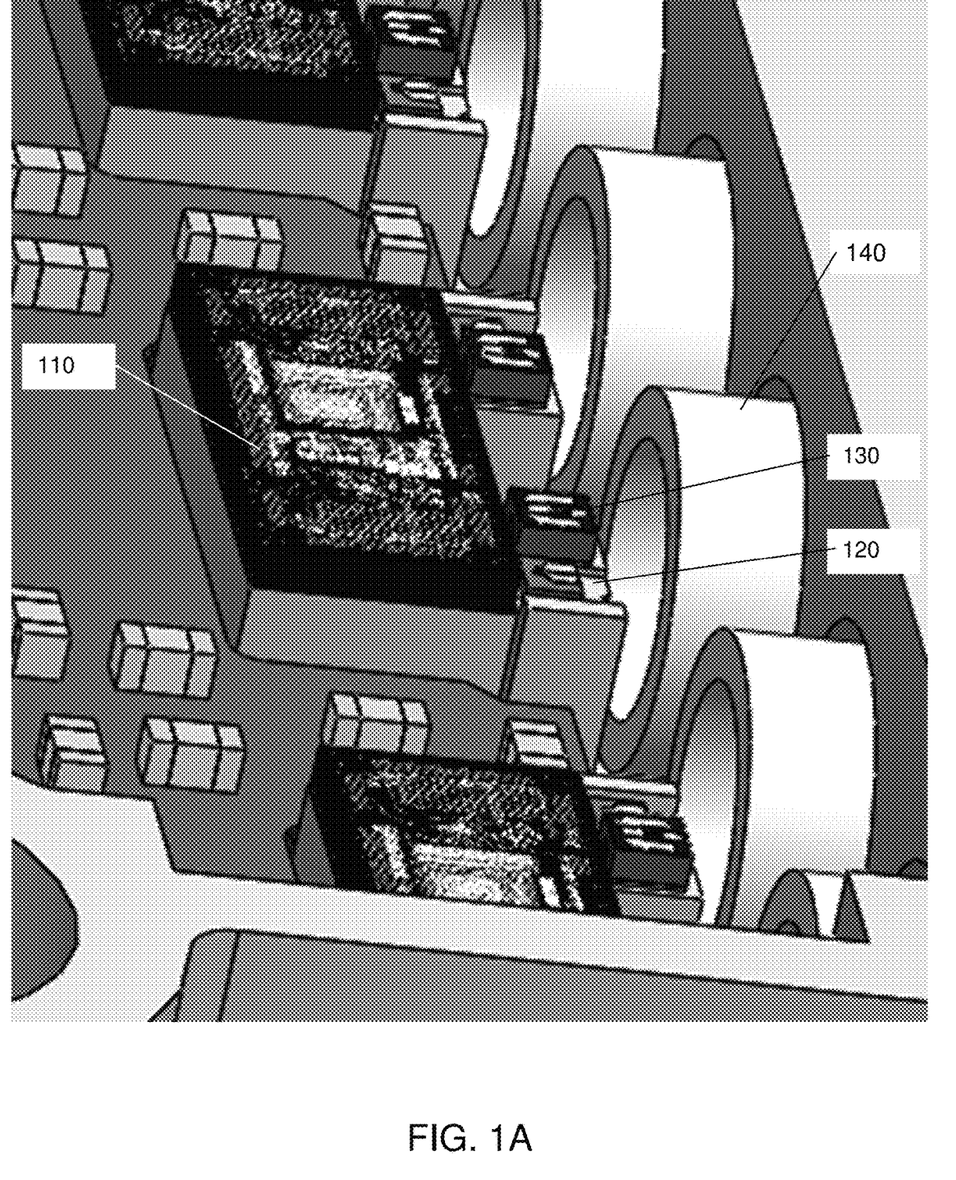
Figure 1B:
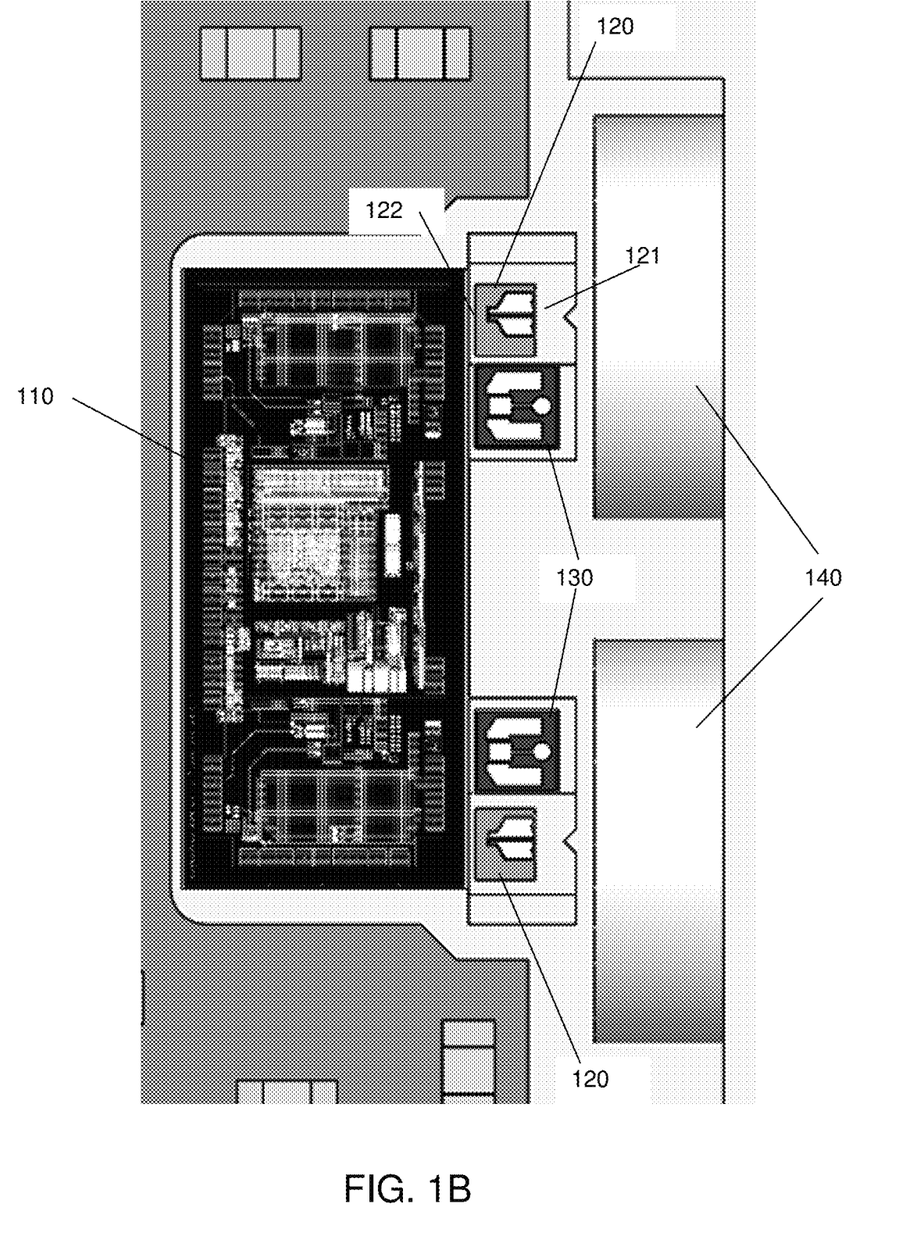

With reference to FIGS. 1A and 1B, an example device is shown, where an ASIC (110) comprises one or more lasers (120) with corresponding monitors (130) and fiber-optic pipes (140). Because the monitor (130) is situated near or next to the laser (120) instead of behind it, the laser (120) is positioned very close to the ASIC (110). The front-facet (121) is oriented toward the fiber optic pipe (140) and is where the output of the laser will originate. The back-facet (122) is facing the ASIC (110) and will originate the back-facet illumination to be detected by the monitor (130) which is also facing (in terms of detection) the ASIC (110). FIG. 1A shows an isometric view and FIG. 1B shows a top view. The substrate of the ASIC acts as a light pipe that couples the back-facet light of the laser to the monitor.

Figure 2A:
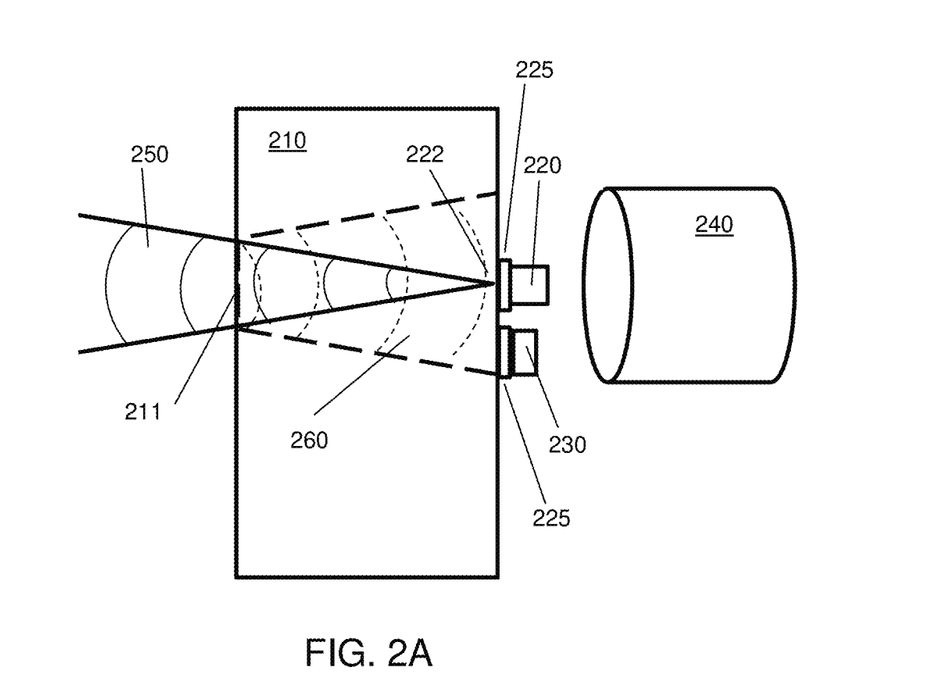
Figure 2B:
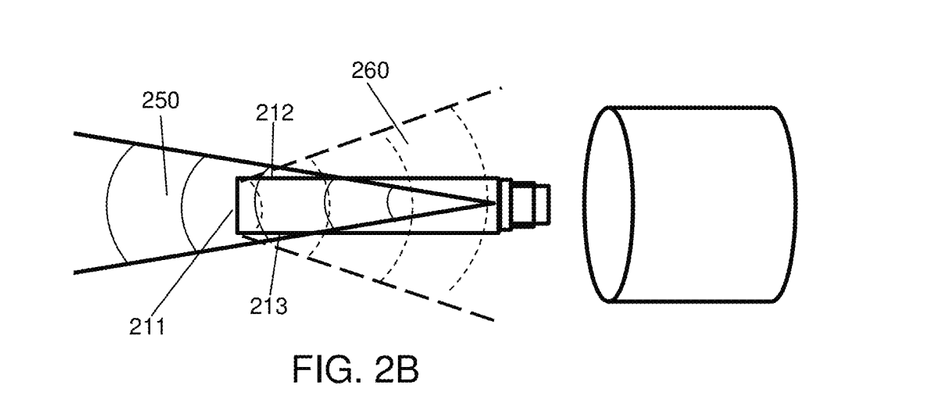

FIGS. 2A and 2B show the laser and monitor in operation. The laser (220) for driving an optical signal into an optical element (240) ("near end" of the ASIC), such as a fiber optic pipe, produces a back-facet illumination (250) in generally a cone shape from the laser's back-facet (222) into the substrate (210) of the ASIC. A portion of the illumination (250) is reflected off the back surface (211) of the ASIC substrate (210) ("far end" of the ASIC) by Fresnel reflection. The reflected light (260) travels back through the substrate (210) and is detected by the monitor (230). FIG. 2A shows a top view and FIG. 2B shows a side view.

Note that due to the thickness of the substrate (210) and the angle of the back-facet light (250), this example shows that not all of the back-facet light (250) will directly strike the rear surface (211) of the substrate (210), with some light striking the top (212) and bottom (213) of the substrate (210). Some portion of this light might be reflected back into the substrate (210), the substrate acting as a light guide, depending on what is deposited on those layers. Optical potting (225) can also be incorporated to reduce the loss at the laser (220) or monitor (230) interface (optical coupling) with the substrate (210). If the index of refraction of the potting material closely matches the substrate the coupling would be optimized. In some cases, the potting can produce an effective gain as it reduces the divergence angle of the light pattern, possibly focusing a larger portion of the returning light (260) into the monitor (230).

The utilization of the substrate as a light guide (light pipe, optical waveguide, etc.) to provide sufficient illumination to the monitor for detection depends on a number of factors.

One is the geometry of the substrate compared to the angle of back-facet cone of illumination. The broader the cone and the narrower the substrate, the more loss the light will have reflecting off the surfaces, and the distance to the back surface of the substrate will also decrease the illumination per unit area of the monitor as the light cones spread out over the distance. An ASIC substrate is typically 200-400 microns thick (top to bottom) and 1-5 mm on a side. The laser die is typically 200-400 microns tall with a back-facet illumination cone of 20 to 40 degrees (full angle).

The frequency of the light and the optical properties of the substrate will determine both how well the light will transmit through the substrate, but also how much will reflect off the back surface. For example, a silicon (Si) substrate is basically optically transparent above 980 nm wavelength for light and has an index of refraction (approx. 3.4-3.5) that will give about a 30% Fresnel reflection at an air interface. Other substances will have other transmission and reflection properties, which would make them either better or worse suited for a particular wavelength of light. The interface in question might not be Si-air in all cases or for all surfaces. However, Si tends to have a higher index of refraction than most substances (such as die epoxy, which is around 1.5-1.6) that would be in contact with the ASIC, so there still might be enough reflection for the device to operate, if properly engineered otherwise.

It is noted that the light cones shown in FIGS. 2A and 2B are simplifications of how the light would actually behave. As previously noted, some of the light will be internally reflected off the top and bottom (and sometimes side) surfaces of the substrate. Also, there is expected to be some scattering at the reflective surfaces. The actual wave patterns will depend largely on how the device is specifically engineered.

Figure 3:
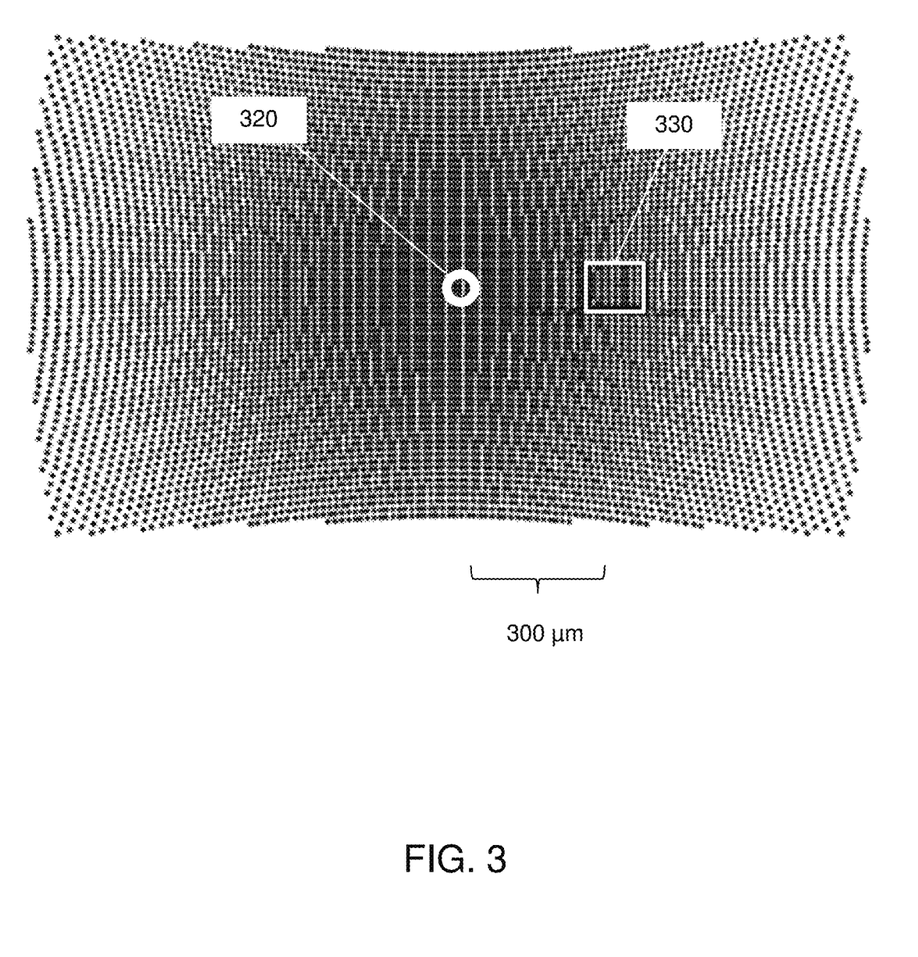
FIG. 3 shows example intensity of a reflected back-facet illumination with an off-set monitor.

FIG. 3 shows a computer-generated estimation of the power (intensity) distribution of the reflected light for an example of the device where the laser (320) and monitor (330) are offset by 300 micrometers. As evidenced by the darker inner region, the area closer to the laser (320) has a stronger return illumination intensity than the areas further away. Therefore, the offset distance is also a factor for detection. A typical range of offset to be used can be 50-200 microns, for example.

The sensitivity of the monitor is also a factor, as a high dark current could mask the signal of a weak input from the reflected light cone. A monitor might have a dark current in the 100 s of nA or 100 s of pA range (ex. 100 pA to 900 nA). Also, different monitors have different collection area sizes, typically 30-200 microns wide.

Figure 4:
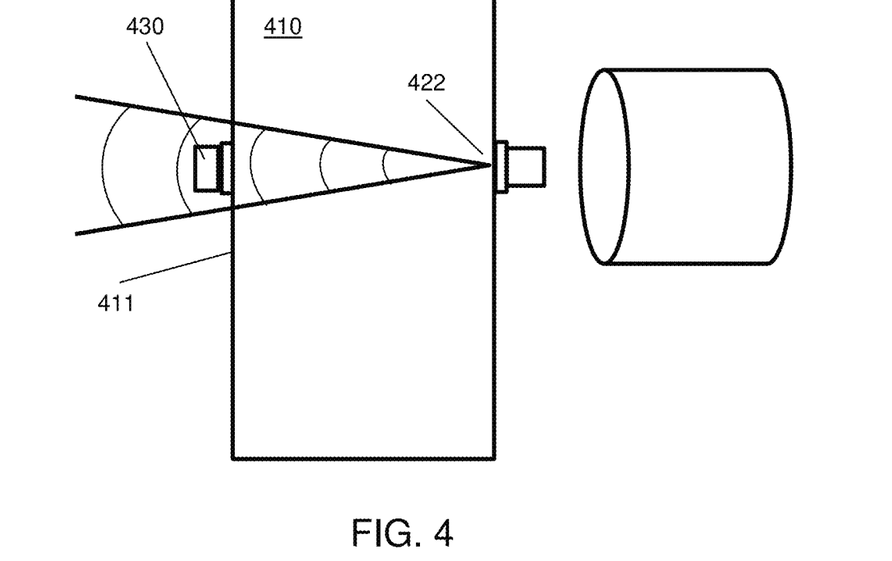
FIG. 4 shows an example of an embodiment where the monitor is situated on the far end of the ASIC substrate.

FIG. 4 shows (in side-view) an alternative configuration, with the monitor (430) being situated on the far end (411) of the ASIC, directly opposing the laser's back-facet (422). While this has the advantage of less loss due to reading the direct light rather than the reflected light, this might not be feasible for some ASIC designs. It presents a larger rectangular footprint and the far end of the ASIC might be used for data input.

Figure 5:
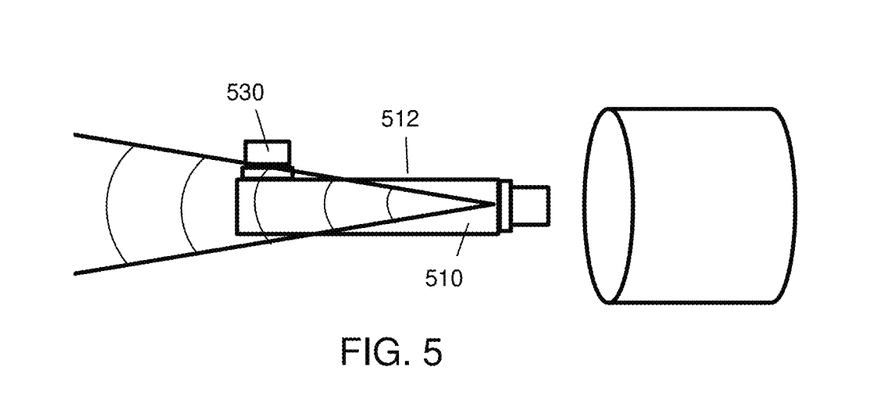
FIG. 5 shows an example of an embodiment where the monitor is situated on the top or bottom of the ASIC substrate.

FIG. 5 shows (in-side view) another alternative configuration, with the monitor (530) being situated on a top (512) (or bottom) surface of the substrate (510). While the light being captured includes direct (and some reflected), it will be a small portion captured at an oblique angle, so the practical use for this configuration will be more limited than others.

Figure 6:
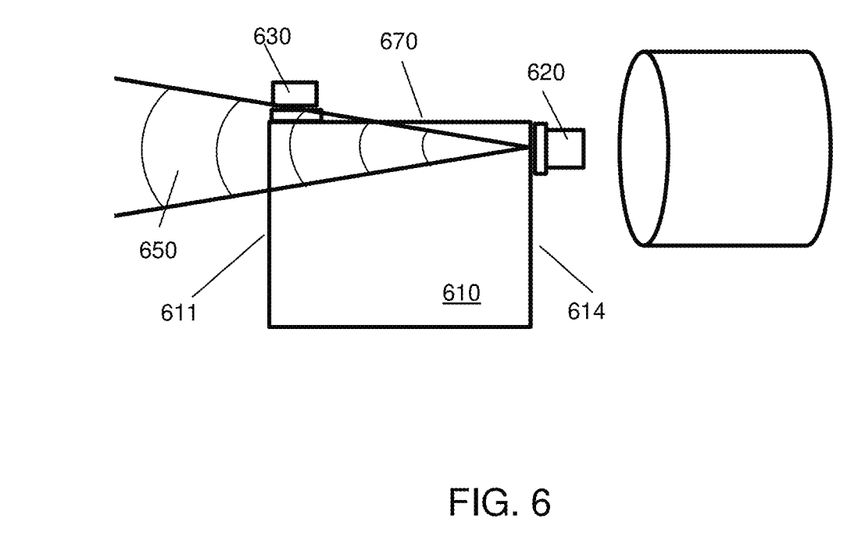
FIG. 6 shows an example of an embodiment where the monitor is situated on the side edge of the ASIC substrate.

FIG. 6 shows (in top-view) another alternative configuration, with the monitor (630) being situated on a side (670) of the substrate (610). Due to the angle of the back-facet illumination cone (650), it typically needs to be closer to the far end (611) than the near end (614) of the ASIC (610). Like FIG. 5 embodiment, this embodiment will capture very little of the back-facet illumination, and so will have limited practical use. Additionally, the laser (620) will need to be close to the side (670) in order for light from the back-facet cone (650) to strike the monitor (630).

Figure 7:
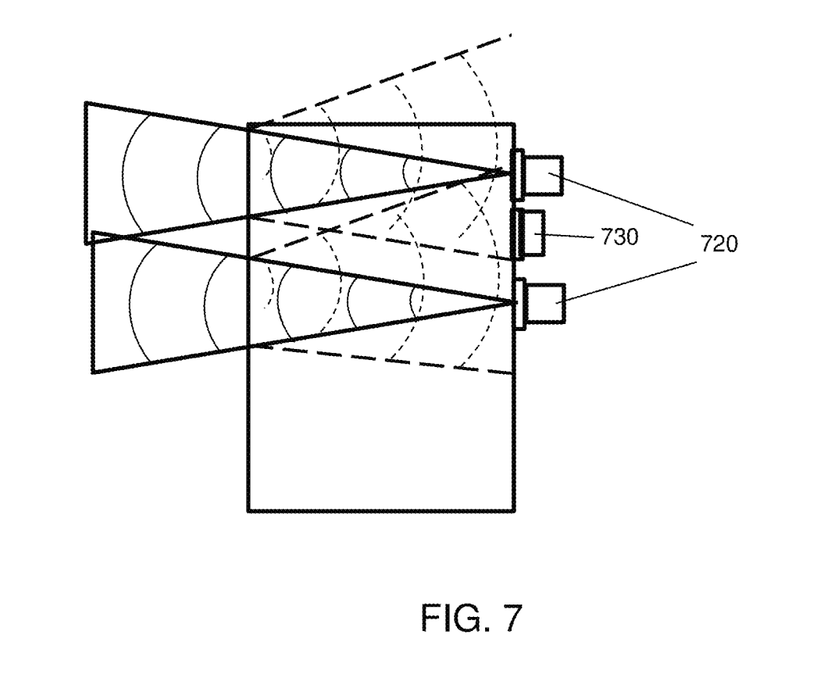
FIG. 7 shows an example of an embodiment where one monitor detects the back-facet illumination of multiple lasers.

IC designs with multiple lasers (see e.g. FIG. 1A) should place the monitors such that each monitor can differentiate back-facet signals from their corresponding laser from the other lasers, if the goal is for each monitor to only signal detection from their corresponding laser. A different configuration is possible, for certain applications, where a monitor can be positioned to signal detection for multiple lasers. This can be either spaced such that the reflected illumination from each laser only encompasses one monitor, or where the lasers are such that the signal strength received at a given monitor is distinguishable by amplitude, phase, or frequency. See FIG. 7 for an example configuration of one monitor (730) detecting the illumination of two lasers (720). For the multiple-laser-one-monitor design, the monitor's sensitivity can be set to signal for the illumination of any one of the lasers, or only signal when a sufficient number of the lasers are active.

It is understood that the specific order or hierarchy of steps in the processes disclosed is an example of applicable approaches. Based upon design preferences, the specific order or hierarchy of steps in the processes may be rearranged while remaining within the scope of the present disclosure. The accompanying method claims present elements of the various steps in a sample order and are not meant to be limited to the specific order or hierarchy presented.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware, various illustrative components, blocks, modules, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

It will be understood that many additional changes in the details, materials, steps and arrangement of parts, which have been herein described and illustrated to explain the nature of the invention, may be made by those skilled in the art within the principle and scope of the invention as expressed in the appended claims.

The invention claimed is:

1. A device comprising:
a substrate having a rectangular shape defined by a top surface and a bottom surface separated by two oppositely arranged pairs of side surfaces, wherein a first pair of the side surfaces consists of
a planar front surface that defines a near end of the substrate; and
a planar back surface that defines a far end of the substrate,
a laser, the laser having a front-facet that provides a main light output of the laser and a back-facet that provides back-facet illumination, the front-facet and the back-facet arranged at opposite sides of the laser, the laser back-facet physically and optically coupled to the planar front surface;
an application specific integrated circuit (ASIC) fabricated on the top surface of the substrate; and
a monitor physically and optically coupled to the planar front surface and arranged near to, and at an offset from, the laser;
wherein the substrate comprises a solid semiconductor material that is transparent to a wavelength of light from the laser, and
wherein the back-facet illumination enters the solid semiconductor material of the substrate through the planar front surface,
travels through the solid semiconductor material of the substrate to reflect off the planar back surface, and
travels through the solid semiconductor material of the substrate to exit the solid semiconductor material of the substrate through the planar front surface for detection by the monitor.

2. The device of claim 1, wherein the substrate comprises silicon and the wavelength is over 980 nm.

3. The device of claim 2, wherein the monitor comprises a photodiode, and the monitor and the laser are potted to the substrate.

4. The device of claim 3, wherein the laser is a laser diode.

5. The device of claim 4, wherein the laser diode is a distributed feedback laser.

6. The device of claim 1, wherein the offset is 50-200 microns.

7. The device of claim 1, wherein the monitor comprises a photodiode.

8. The device of claim 1, wherein the laser is a laser diode.

9. The device of claim 1, wherein the laser is a distributed feedback laser.

10. The device of claim 1, wherein the laser and the monitor are potted to the substrate.

11. The device of claim 1, further comprising:
an additional laser, the additional laser having an additional front-facet that provides an additional main light output of the additional laser and an additional back-facet that provides an additional back-facet illumination;
the additional laser being situated such that the additional back-facet is physically and optically coupled to the planar front surface; and
an additional monitor capable of detecting of the additional back-facet illumination, the additional monitor being physically and optically coupled to the planar front surface and offset from the additional laser;
wherein the solid semiconductor material of the substrate is further transparent to a wavelength of light from the additional laser and the planar back surface of the substrate is further reflective of the additional back-facet illumination.

12. The device of claim 11, wherein the additional monitor comprises a photodiode, and the additional monitor and the additional laser are potted to the substrate.

13. The device of claim 12, wherein the additional laser is a laser diode.

14. The device of claim 13, wherein the laser diode is a distributed feedback laser.

15. The device of claim 11, wherein the additional monitor and the additional laser are potted to the substrate.

16. The device of claim 1, further comprising:
a plurality of additional lasers, each additional laser of the plurality of additional lasers having a respective front-facet that provides a respective main light output of the additional laser and a respective back-facet that provides a respective back-facet illumination, the respective front-facet and the respective back-facet arranged at opposite sides of the each additional laser;
the plurality of additional lasers being situated such that the respective back-facet of each additional laser is physically and optically coupled to the planar front surface;
and the monitor is further capable of detecting the respective back-facet illumination of each additional laser of the plurality of additional lasers,
wherein the solid semiconductor material of the substrate is further transparent to a respective wavelength of light from each additional laser of the plurality of additional lasers and the planar back surface of the substrate is further reflective of the respective back-facet illumination of each additional laser of the plurality of additional lasers.

17. The device of claim 1, further comprising:
a fiber optic pipe arranged proximal the front-facet, wherein the fiber optic pipe is configured to receive the main light output from the front-facet.

18. The device of claim 1, wherein a direction of the main light output from the front-facet is opposite a direction of the back-facet illumination output from the back-facet.

19. The device of claim 1, wherein
a direction of the main light output from the front-facet is away from the planar front surface and the planar back surface of the substrate, and
a direction of the back-facet illumination output from the back-facet is towards the planar front surface and planar back surface of the substrate.

20. The device of claim 1, wherein
the laser includes a laser die having a height in a range from 200 to 400 microns, and
the back-facet illumination has a cone shape with a full angle in a range from 20 to 40 degrees.

21. The device of claim 1, wherein the monitor is a photodetection device that converts a photonic input that is based on the back-facet illumination into an electrical signal output.

* * * * *